United States Patent [19]

Anazawa et al.

[11] 4,340,901
[45] Jul. 20, 1982

[54] LEAD CONNECTING STRUCTURE FOR A SEMICONDUCTOR DEVICE

[75] Inventors: Shinzo Anazawa; Hideaki Kozu, both of Tokyo, Japan

[73] Assignee: Nippon Electric Co., Ltd., Tokyo, Japan

[21] Appl. No.: 105,964

[22] Filed: Dec. 21, 1979

Related U.S. Application Data

[63] Continuation of Ser. No. 879,863, Feb. 22, 1978, abandoned.

[30] Foreign Application Priority Data

Feb. 25, 1977 [JP] Japan .............................. 52-22962[U]

[51] Int. Cl.³ .................... H01L 23/48; H01L 29/44; H01L 29/52
[52] U.S. Cl. ...................................... 357/68; 357/65; 357/71; 357/80
[58] Field of Search .................... 357/65, 68, 71, 80

[56] References Cited

U.S. PATENT DOCUMENTS

| | | | |
|---|---|---|---|
| 3,277,232 | 10/1966 | Ragan | 357/68 |
| 3,405,382 | 10/1968 | Wright | 357/68 |
| 3,584,265 | 6/1971 | Nier | 357/68 |
| 3,681,667 | 8/1972 | Kokosa | 357/68 |
| 3,715,633 | 2/1973 | Nier | 357/68 |
| 3,872,583 | 3/1975 | Beall et al. | 357/80 |
| 3,908,186 | 9/1975 | Anazawa et al. | 357/68 |
| 4,141,028 | 2/1979 | Huistrunk | 357/68 |
| 4,185,317 | 1/1980 | Lambrecht | 357/68 |

*Primary Examiner*—Andrew J. James
*Attorney, Agent, or Firm*—Hopgood, Calimafde, Kalil, Blaustein & Judlowe

[57] ABSTRACT

An improved brazing structure is disclosed in which at least a tip end portion to be brazed of a lead is bent and this tip end portion is bonded to a metallized layer by a brazing material substantially in perpendicular to the plane of the metallized layer.

8 Claims, 9 Drawing Figures

LEAD CONNECTING STRUCTURE FOR A SEMICONDUCTOR DEVICE

This is a continuation of copending application Ser. No. 879,863, filed Feb. 22, 1978, now abandoned.

BACKGROUND OF THE INVENTION

The present invention relates in general to a brazing structure, and more particularly to a brazing structure for an external lead in a semiconductor device.

Metallic members such as external leads are often brazed to a substrate or a package for an electronic circuit having a compact conductor pattern, or a substrate or a ceramic main body of a package for an ultra-high frequency device. In such brazing structure, a severe restriction is imposed upon the geometrical brazing structure because of its electrical performance and its associated structure. Especially, a parasitic reactance component such as a stray capacity, a parasitic inductance or the like of substrate or a package for high-frequency devices largely affects their performance. Therefore, the size of the substrate or the package is made small, in order to reduce the parasitic reactance component. As a result, an area for brazing an external lead is also limited to a small area. In a prior art brazing structure between a lead and such a substrate or a package, brazing was effected with a plane of a lead placed in parallel to a metallized surface of a ceramic substrate, as represented by the brazing structure disclosed in U.S. Pat. No. 3,946,428.

However, in the prior art brazing structure, a bonding strength becomes minimum when an external force is applied to the lead so as to pull up the lead in the direction perpendicular to the bonding surface. The bonding strength under this condition is hereinafter called "pull-up strength". Upon handling of a semiconductor device having external leads, the aforementioned external force having a pulling-up nature is liable to be applied to the leads, and therefore, larger pull-up strength is highly desirable to make a semiconductor device reliable and easy for handling. Especially in a device having such a structure that metallized layers are formed on a substrate having a low mechanical strength such as beryllia ceramics or the like and external connection leads are brazed to the metallized layers, the metallized layers or the boundary between the substrate and the metallized layers are liable to be destroyed by an external force, and an anti-destructive brazing structure is essentially necessary.

SUMMARY OF THE INVENTION

It is one object of the present invention to provide a brazing structure which has a high bonding strength against an external force exerted in the direction substantially perpendicular to a brazed surface.

Another object of the present invention is to provide an external lead structure for a semiconductor device that is rigid and easy to handle.

Still another object of the present invention is to provide a practical semiconductor device for ultra-high frequency use whose parasitic reactance is small.

According to the present invention, a brazed portion of a conductive member extends in the direction substantially perpendicular to a bonding surface, while an unbrazed major portion of the conductive member extends substantially in parallel to the bonding surface.

More particularly, according to the present invention, there is provided a package for electronic parts characterized in that an external connection lead is brazed to a wiring section of a metallized layer on an insulator substrate with a tip end of the lead bent at a substantially right angle and directed substantially perpendicularly to the surface of the metallized layer.

DETAILED DESCRIPTION OF THE PRIOR ART

Figure 1:
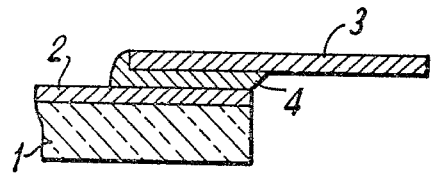
FIGS. 1 and 2 are cross-sectional views respectively showing brazing structures in the prior arts.

As shown in FIG. 1, in a substrate for a prior art flat-type semiconductor device, a metallized layer 2 adapted for brazing is deposited in a predetermined shape on a surface of an insulator 1 such as ceramics to form a lead mounting section, and an external connection lead 3 is brazed on the surface of the lead mounting section with a brazing material 4. As is well known, in a substrate or a package to be used for the ultra-high frequency band, lead wires for its electrodes or the like generally have a strip line structure, and the surface of the lead mounting section on the insulator 1 and the external connection lead 3 are brazed in parallel to each other.

In such a lead brazing structure, the brazing strength in case where the lead 3 is pulled up in the direction perpendicular to the surface of the lead mounting section, that is, the pull-up strength cannot be made sufficiently high. Especially for the use in the ultra-high frequency band, as described previously, a sufficient brazing area cannot be provided because a configuration of a substrate or a package must be selected as small as possible for minimizing an effect of parasitic reactances. Accordingly, the pull-up strength of the bonded portion becomes very low. For instance, in order to braze a lead of 0.6 mm in width to a ceramics body so as to have a sufficient pull-up strength, a metallized layer 2 having the area of 1 mm×1 mm is necessary. However, since the above-referred substrate for use in the ultra-high frequency band is very small in size, in most cases only the area of 0.7 mm×0.5 mm can be permitted at the maximum to form the metallized layer 2 serving as a bonding area. While the pull-up strength required for this brazing area is 0.9 Kg or higher, the brazing structure in the prior art as shown in FIG. 1 presents only a pull-up strength of 0.4~1.5 Kg, and hence it is not applicable to practical uses.

Figure 2:
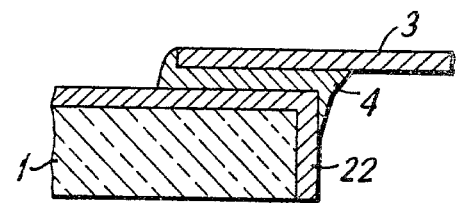

Otherwise, as shown in FIG. 2, modification can be made in the prior art in such manner that a metallized layer 22 is provided on both the upper and side surfaces of the insulator substrate 1 and a lead 3 is brazed with a brazing material 4 contacting to both those surfaces. However, even with such structure, for the above-referred bonding area only a pull-up strength of 0.6~2 Kg can be obtained.

DETAILED DESCRIPTION OF PREFERRED EMBODIMENTS

According to the present invention, in order to overcome the above-mentioned difficulties, a tip end portion of an external connection lead 33 is bent in a L-shaped form, and the tip end portion is brought in contact with an approximate center of the brazing area of the metallized layer 2 on the insulator substrate 1 substantially in perpendicular to the surface of the metallized layer 2 and is brazed with a brazing material 4. The brazing material 4 is made to adhere, wet and form a miniscus with the bent tip end portion of the external connection lead 33 but not to extend to the parallel portion of the lead 33. It is favorable to make the brazing material 4 equally distribute on the respective sides of the external connection lead 33.

Figure 4A:
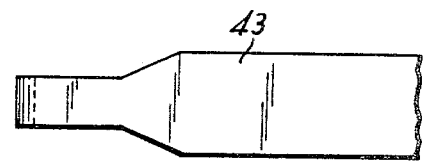
FIGS. 4A and 4B show one example of an external connection lead to be used according to the present invention in plan and side views, respectively.
Figure 4B:

In one preferred embodiment of the present invention, the brazing area of the metallized layer 2 is selected equal to 0.7 mm×0.5 mm similarly to the prior art example, and a pull-up strength of 1~3 Kg was obtained. In a more preferred embodiment of the present invention, a tip end of an external connection lead 43 is narrowed in width as shown in FIGS. 4A and 4B. It has been proved that with this lead structure, fluctuations in the deposition of the brazing material 4 upon brazing can be suppressed, resulting in reduction of the fluctuations in the pull-up strength, and thereby a production yield can be enhanced.

Figure 3:
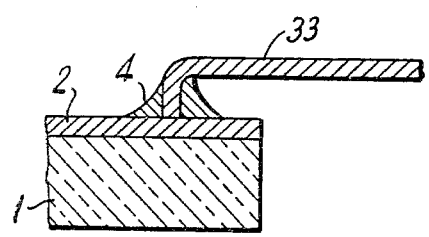
FIG. 3 is a cross-sectional view showing are preferred embodiment of the brazing structure according to the present invention.
Figure 5A:
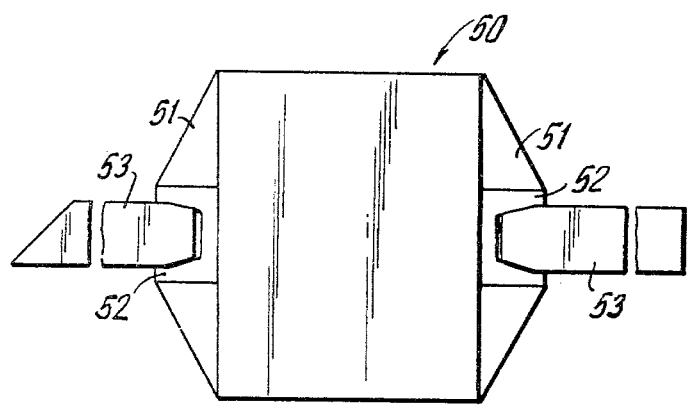
FIGS. 5A and 5B show an entire semiconductor device incorporating the present invention in plan and side views, respectively.
Figure 5B:
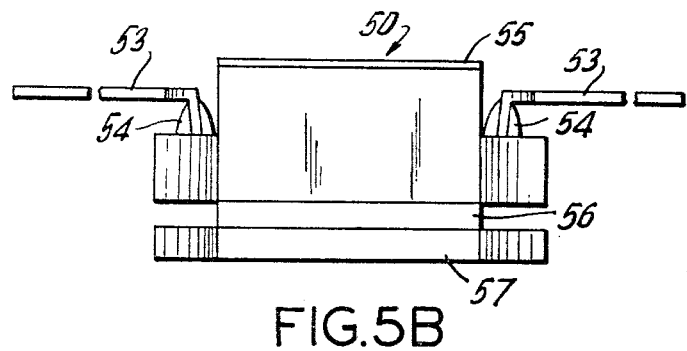

FIGS. 5A and 5B are a plan view and a side view, respectively, showing one preferred embodiment of the present invention as applied to an external lead structure for GaAs field effect transistors, in which a package 50 made of beryllia ceramics is provided with lead bonding sections 51 formed in a trapezoidal shape at its opposite ends. A lid 55 made of ceramics is bonded to the upper surface of the package 50 by a silver solder, and a heat radiating copper base 57 is also bonded to its lower surface via a washer 55 made of Kovar (a nickel-iron-cobalt alloy) by a silver solder. The upper surfaces of the lead bonding sections 51 are provided with metallized layers 52 electrically connected to an FET encapsuled in the package 50, which metallized layers have a somewhat broader width than lead wires 53 (In FIG. 5B, the metallized layer 52 is omitted from illustration.) Similarly to the embodiment shown in FIG. 3, the lead wire 53 made of Kovar has its brazing portion bent substantially in perpendicular to its principal portion and is brazed with a silver-copper brazing material 54 to the known metallized layer 52 formed of materials selected from tungsten, molybdenum, manganese, nickel, etc. (In FIG. 5A, the brazing material 54 is omitted from illustration for clarification). Now presenting, by way of example, the dimensions of the essential parts of the semiconductor device of FIG. 5, the lead wire 53 has a length of 7.4 mm, a width of 0.6 mm and a thickness of 0.1 mm, the width being narrowed to 0.3 mm at one end, and the width is gradually narrowed from a point that is 0.5~0.7 mm apart from said one end. In addition, the lead wire 53 is bent by an angle substantially equal to 90° at a point that is 0.4 mm apart from said one end. The metallized layer has a width of 0.7 mm and a length in the direction of the lead of about 0.5 mm. The package 50 has a height of 1.2 mm, a length of an upper section of 2.4 mm and a length of a lower section including the lead bonding sections 51 of 3.5 mm, and the height of the lead bonding section is 0.6 mm. The washer 56 has a square shape of 2.4 mm×2.4 mm and a thickness of 0.3 mm. The copper base 57 has a thickness of 0.3 mm and is formed in the same shape as the bottom surface configuration of the package 50.

Figure 6:
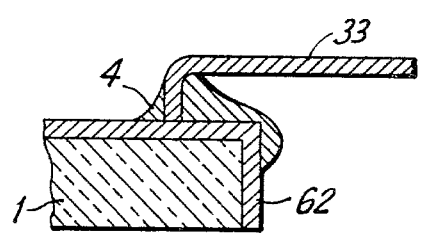
FIGS. 6 and 7 are cross-sectional views respectively showing other preferred embodiments of the brazing structure according to the present invention.

In an alternative embodiment of the present invention, as shown in FIG. 6 a metallized layer 62 is provided on both the upper and side surfaces of the insulator substrate 1 and a lead 33 is brazed in such manner that a brazing material 4 may contact with these two surfaces. In this case, a pull-up strength of 1.2~3 Kg can be obtained for the above-referred bonding area.

Figure 7:
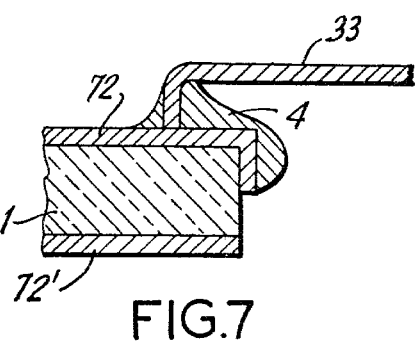

In another preferred embodiment of the present invention shown in FIG. 7, a metallized layer 72 formed on the upper and side surfaces of the insulator substrate 1 and another metallized layer 72' formed on the back surface of the substrate 1 are electrically isolated so that the invention can be applied to a semiconductor device which makes use of the metallized layer 72' as a grounded electrode. It is a matter of course that in order to reduce a parasitic capacity between these electrodes, various techniques such as sufficiently separating these metallized layers from each other, are arbitrarily adopted.

Also, as a matter of course, the configuration of the brazing portion of the external connection lead is not limited to the shape illustrated in FIGS. 4A and 4B but it could be modified according to requirements. Furthermore, the tip end portion of the lead need not be bent correctly at a right angle, but the angle is defined roughly, and it is desired that the tip end portion is angled with respect to the surface of the metallized layer by 45° or more, preferably by an angle in the range of 70° to 110°.

By making use of such brazing structures, a strip-line type substrate provided with external connection leads having a high bonding strength can be obtained while a performance of a ultra-high frequency device is almost not degraded. Especially, this brazing structure is extremely effective for a ceramics substrate having defects at its peripheral portions, and it is particularly effective for a substrate having an uneven density of ceramics due to the green sheet process or a substrate having many defects caused by shaping.

We claim:

1. A brazing structure comprising a support member having a brazable plane, a brazable elongated external lead having its one end portion brazed to said brazable plane inwardly of an edge of said support member with the remaining elongated portion of said lead extending freely from said end portion substantially parallel to said brazable plane, and means for protecting the connection between said one end portion of said lead and said brazable plane as well as between said brazable plane and said support member against pull up stresses to be applied to said lead, said protecting means including a bend at said one end portion of said lead and a solder so connecting the bent end portion of said lead to said brazable plane that the tip end of said bent end portion abut on said brazable plane at a portion spaced from said edge of said support member.

2. The brazing structure as claimed in claim 1, wherein said support member includes an insulating body and a metallic portion formed on a plane of the surface of said insulating body and wherein said elongated external lead is provided as a strip form.

3. The brazing structure as claimed in claim 2, wherein the width of said one end portion of said elongated external lead is smaller than the width of said remaining elongated portion.

4. The brazing structure as claimed in claim 2, wherein the brazing area of said metallic portion has a width not more than 0.7 mm and a length not more than 0.5 mm.

5. The brazing structure as claimed in claim 2, wherein said insulating body is made of beryllia ceramic.

6. A semiconductor device comprising an insulator member supporting a semiconductor elements, metallized layer provided on one surface of said insulator member and electrically connected to said semiconductor element, and at least one elongated external lead having a bent end portion connected by solder to said metallized layer inwardly of an edge of said insulating member and spaced apart from said edge, with the remainder of said at least one elongated lead extending freely and outwardly from said insulator member, said solder wetting and creeping up along said bent end portion of said external lead, whereby the connection between said bent end portion of said external lead and said metallized layer and between said metallized layer and said one surface of said insulator member is protected against pull up stresses to be applied to the free end of said external lead.

7. The semiconductor device of claim 6, wherein said solder creeping up along said bent end portion of said external lead reaches the bent point of said external lead.

8. A semiconductor device comprising an insulator member supporting a semiconductor element, metallized layer provided on said insulator member and extending from an upper surface of said insulator member to a side face thereof, and an elongated external lead having a bent end portion connected by solder to said metallized layer on said upper surface of said insulating member inwardly of an edge of said insulating member and spaced apart from said edge, with the remainder of said external lead extending freely and outwardly from said insulator member, said solder adhering to said metallized layer both on said upper surface and on said side face of said insulator member, whereby the connection between said bent end portion of said external lead and said metallized layer as well as between said metallized layer and said insulator member is protected against pull up stresses to be applied to said external lead.

* * * * *